(12) United States Patent
Korsunsky et al.

(10) Patent No.: US 6,267,609 B1
(45) Date of Patent: Jul. 31, 2001

(54) EJECTION MECHANISM

(75) Inventors: Iosif Korsunsky; Joseph Olevich, both of Harrisburg, PA (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/162,946

(22) Filed: Sep. 29, 1998

(51) Int. Cl.⁷ .................................................. H01R 13/62
(52) U.S. Cl. .......................................... 439/160; 439/159
(58) Field of Search .................................. 439/160, 157, 439/159

(56) References Cited

U.S. PATENT DOCUMENTS

| | | | |
|---|---|---|---|
| 3,157,088 | * 11/1964 | Zillmer | 439/160 |
| 3,516,042 | * 6/1970 | Wagner | 439/160 |
| 3,526,868 | * 9/1970 | Mattson et al. | 439/160 |
| 4,511,199 | 4/1985 | Erlam et al. | 339/45 M |
| 4,583,807 | 4/1986 | Kaufman et al. | 3398/125 |
| 5,269,698 | * 12/1993 | Singer | 439/157 |
| 5,318,452 | 6/1994 | Brennian, Jr. et al. | 439/79 |
| 5,322,448 | * 6/1994 | Hahn | 439/157 |
| 5,368,493 | 11/1994 | O'Brien et al. | 439/160 |
| 5,440,448 | 8/1995 | Stewart et al. | 361/684 |
| 5,481,431 | * 1/1996 | Siahpolo et al. | 439/160 |
| 5,499,925 | * 3/1996 | Lwee | 439/157 |
| 5,503,564 | 4/1996 | Futatsugi et al. | 439/157 |
| 5,571,025 | 11/1996 | Arai et al. | 439/160 |
| 5,577,922 | 11/1996 | Enomoto et al. | 439/157 |
| 5,707,245 | 1/1998 | Yamamoto et al. | 439/160 |
| 5,730,610 | 3/1998 | Hsia et al. | 439/160 |

* cited by examiner

Primary Examiner—Renee Luebke
Assistant Examiner—Briggitte R. Hammond

(57) ABSTRACT

The present invention provides an ejection mechanism 10 having an ejector 60 mounted within a housing 40. The housing 40 has an electronic module receiving area 48 and a connector receiving area 50. The ejector 60 is secured to the housing 40 by a pivot pin 80 passing through pivot openings 66, 27, 43. The ejector 60 may be simply urged from a first position to a second position such that a projection 70 causes the electronic module to be ejected.

9 Claims, 4 Drawing Sheets

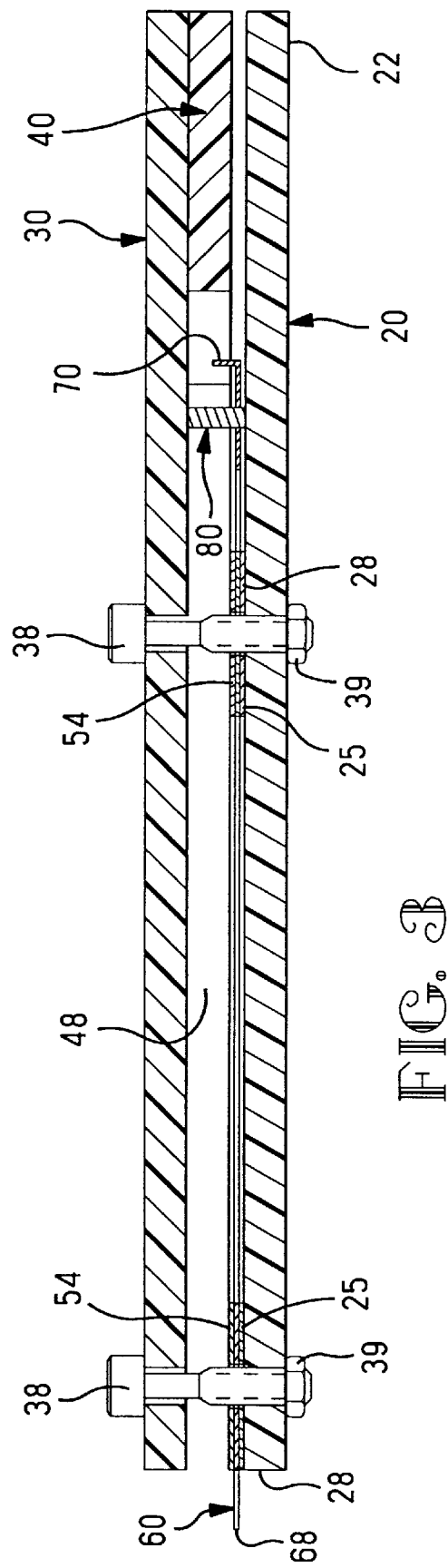

EJECTION MECHANISM

FIELD OF THE INVENTION

This invention is related to electrical connectors and more particularly to an ejection mechanism for use in an electrical connector for an electronic module.

BACKGROUND OF THE INVENTION

Personal computers are being designed to utilize removable electronic modules for data storage, communications, or for the connection of other peripheral devices to the personal computer. Data storage devices include memory cards or hard disk drive packages. Communication devices include modems, network interface cards, and other such related devices. Electrical connector assemblies have been developed for connection of these removable electronic modules. For example, the Personal Computer Memory Card International Association (PCMCIA) established memory card (PC Card) standards defining the PC Card's physical outline standards, connector system and qualification test parameters, including reliability, durability and environmental test parameters in its PC card standard, Release 2.0, PCMCIA (September 1991).

One example of such an electrical connector assembly is shown in U.S. Pat. No. 4,583,807. This patent shows a connector assembly having contacts positioned in parallel rows along the longitudinal axis of the connector housing, with tail sections extending rearwardly and downwardly from the housing to be soldered to the board.

Examples of memory card connector assemblies having ejection mechanisms are shown in U.S. Pat. Nos. 5,499,925 and 5,730,610. In U.S. Pat. No. 5,499,925 Lwee teaches a disengageable release mechanism provided for ejecting a data storage medium from the connector assembly upon manual operation of an ejection handle. The release mechanism is disengaged, and therefore inoperable, when a data storage medium is fully inserted in the connector assembly and the ejection handle is in a first position. The release mechanism becomes engaged, and therefore operable to eject the data storage device, only after the ejection handle is manually moved from the first position to an extended position. Because the ejection handle must be moved from the first position to the extended position in order to engage the release mechanism, inadvertent ejection of the data storage medium is avoided.

In U.S. Pat. No. 5,730,610, Hsia et al. teach an electrical connector assembly having an eject plate moveably mounted on a frame and operable to slide away from a header to eject a card-like electronic medium. A link arm is typically connected to the frame and has an eject plate engagement means for moving the eject plate away from the header to eject the memory card. An elongated activator means such as an elongated rod for pivoting said link is provided to move the eject plate and the memory card away from the header. The elongated activator means has a front first position and a rear second position. A rod manipulation means having a push button is also provided at the front terminal end of the activator means. When axial force is applied to the push button, the elongated activator means is displaced from its first front position to its second rear position to pivot the link arm. Means are provided to then turn the elongated activator means back to its first forward position after it has been displaced to its second rearward position to pivot the link arm. The means for returning the activator means to its first forward position may, for example, be an axial helical spring. The rod manipulation means may also be folded to a transverse position.

Each of the ejection mechanisms shown in these patents involves a complex mechanical linkage between an activator rod and a slide plate or pivot arm. Additionally, both require a spring in the mechanical linkage for biasing the rod to a desired position. A problem exists in that these complex linkage arrangements require many parts and are therefore costly to manufacture. Additionally, reliability may be compromised by the addition of parts and the complexity of the mechanical linkage.

SUMMARY

It is therefore an object of the present invention to provide a simple ejection mechanism for an electronic module having fewer parts.

It is a further object of the invention to provide an ejection mechanism wherein the exposed portion of the ejector can be recessed into the assembly to avoid inadvertent ejection of the electronic module.

These and other objects have been achieved by providing an ejection mechanism for an electrical connector assembly which receives an electronic module. The ejection mechanism has a housing which includes a module receiving area in communication with a connector receiving area. An ejector formed of a planar material is mounted to the housing at a pivot point and extends from the pivot point to a free end. The ejector has a first leg extending from the pivot point and a second leg extending at an angle from the first leg. The free end is positioned along an edge of the housing such that it is recessed in the first position and may be urged across the edge to cause rotation about the pivot point resulting in ejection of an electronic module inserted into the module receiving area.

BRIEF DESCRIPTION OF THE DRAWINGS

FIG. 3 shows a cross sectional view of the ejection mechanism taken along the line 3—3 of FIG. 2.

DETAILED DESCRIPTION OF THE EMBODIMENTS

Figure 1:
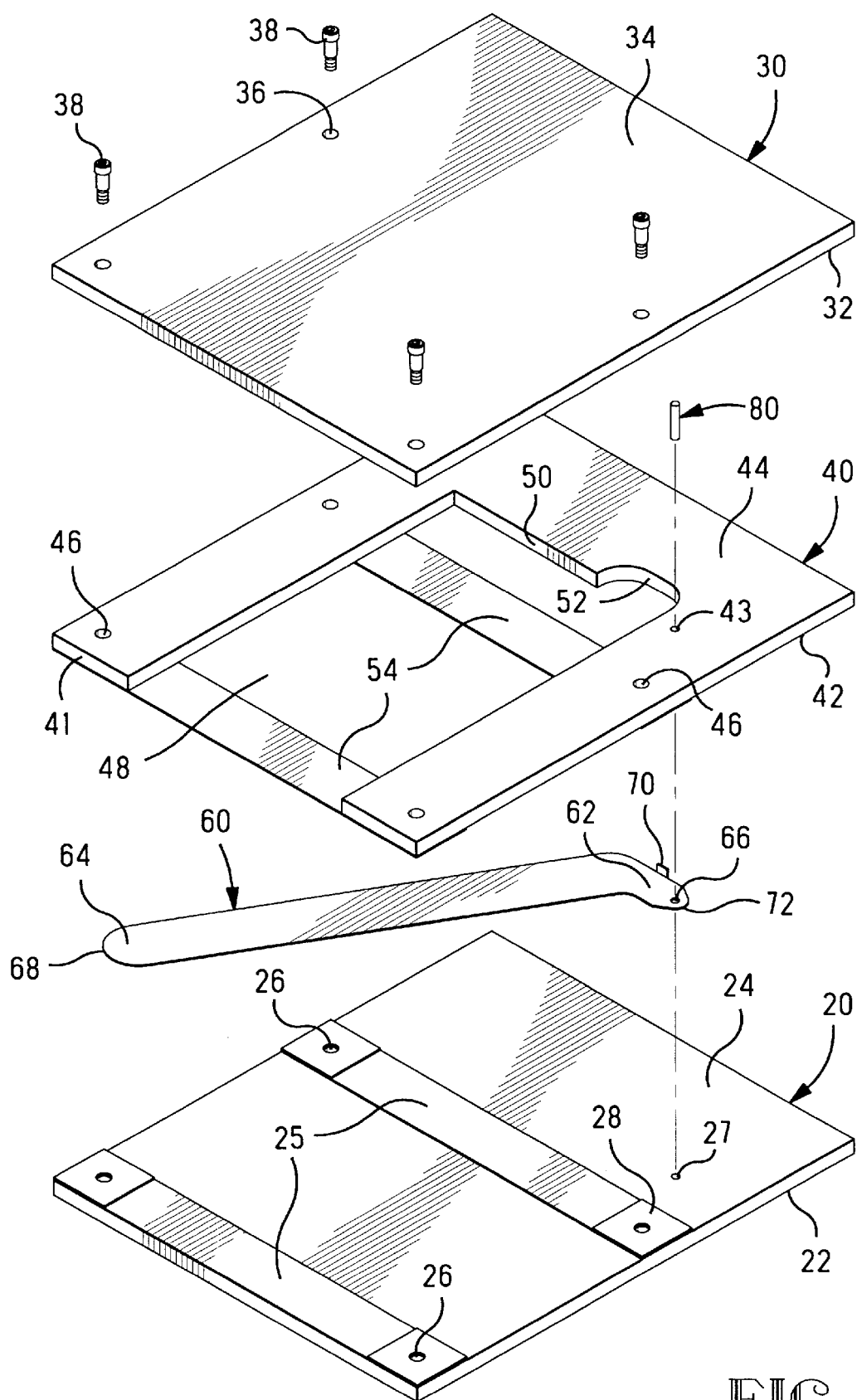
FIG. 1 shows an exploded three-dimensional view of the ejection mechanism according to the present invention.

The ejection mechanism 10 according to the present invention will first be described generally with reference to FIG. 1. This figure shows an exploded view of the ejection mechanism 10 having five major components: a base 20, an ejector 60, a housing 40, a pivot pin 80, and a cover 30. The ejector 60 is mounted to the assembly 10 between the base 20 and the housing 40 by a pivot pin 80 which passes through openings 43 in the housing 40, and openings 66, 27 in the ejector and base 60, 20. The free end 68 of the ejector 60 is slidable across the an edge 41 of the housing 40 to cause rotation of the ejector 60 about the opening 66 or pivot point. A cover 30 is mounted over the housing 40 and secured with appropriate fasteners 38 passing through openings 36, 46, 26.

Each of the major components will now be described in greater detail again with reference to FIG. 1. The base 20 is formed of an insulating material and has a top surface 24 and a bottom surface 22. The bottom surface may be mounted to a printed circuit board or other electronic device by well known mounting techniques including but not limited to board locks, compliant pin sections, through hole soldering, or surface mount technology. An opening 27 extends partially through the base from the top surface 24. This opening 27 may optionally extend through to the bottom surface 22. Also along the top surface, a pair of slide rails 25 are arranged in a parallel manner between opposed ends. A plurality of spacers 28 are disposed on top of the slide rails 25. Openings 26 extend through the spacers 20, the slide rails 25 and the base 20 to the bottom surface 22. The slide rails 25 may be optionally removed provided that the top surface 24 and bottom surface 42 have sufficient wear characteristics to accommodate sliding of the ejector 60 thereacross.

The ejector 60 will now be described in greater detail. It is formed of a planar material and features a first leg 62 and a second leg 64 which extends from the first leg 62 at an angle. A thin metal material is preferred for forming the ejector however other suitable insulative materials being substantially ridged to provide the necessary ejection force could be used. The first leg 62 is shorter than the second leg 64. The first leg begins at an end 72 and extends to the second leg 64. A pivot opening 66 is formed near the end 72. A projection 70 extends from an edge of the first leg 62 approximately perpendicular thereto. The second leg 64 extends at an angle from the first leg 62 to a free end 68. It should be understood that while the second leg 64 is shown in this embodiment to extend toward the edge 41, it could be easily modified to extend toward any of the other three edges of the housing 40.

The housing 40 will now be described in greater detail. It features a top surface 44 and a bottom surface 42. Mounted along the bottom surface 42 are a pair of complementary slide rails 54. These slide rails have openings corresponding to openings 46 formed in the housing 40 which extend from the bottom surface 42 to the top surface 44. A pivot opening 43 also extends from the top surface 44 to the bottom surface 42. An electronic module receiving area 48 extends from an edge 41 toward the opposite end. A connector receiving area 50 is also disposed opposite the leading edge 41. A curved surface 52 is formed adjacent the connector receiving area 50 for accommodating rotation of the ejector 60. The pivot pin 80 is generally cylindrical in shape and profiled to extend from the cover 30 through the housing 40 and the ejector 60 into the base 20. It should be understood by those reasonably skilled in the art that the connector receiving area 50 will need to be modified to accommodate the selected electrical connector most suitable for a particular application. Electrical connectors which may be selected include card edge receiving connectors, connectors matable with other mating connectors, surface mounted connectors, through hole mounted connectors, and other electrical connectors suitable for mating with electronic modules. An example of such a connector is shown in U.S. Pat. No. 5,318,452 which is incorporated herein by reference. It should be clear to those reasonably skilled in the art that modifications to the base 20 and housing 40 will be necessary to allow for contact tails to pass therethrough for connection to a substrate such as a printed circuit board to which the ejection mechanism 10 will be mounted. It will be apparent to those reasonably skilled in the art how to modify the housing 40, base 20 and cover 30 in order to accommodate the various types of electrical connectors which may be accepted by the connector receiving area 50.

The cover 30 consists of a planar material having a top surface 34 and a bottom surface 32. A plurality of openings 36 extend from the top surface 34 through to the bottom surface 32. A plurality of fasteners 38 are disposed inside the openings 36 and also pass through openings 46 and 26 to the bottom surface 22 of the base 20. It should be understood that while these fasteners 38 are shown as bolts secured to nuts 39 on the bottom surface 22 of the base 20, other suitable fasteners such as self tapping screws may be utilized. Additionally, suitable adhesives may be utilized to secure the major components to each other.

Assembly of the ejection mechanism 10 will now be described in greater detail with reference again to FIG. 1. First, the slide rails 25 are positioned on the base 20 such that openings 26 are aligned. The slide rails 25 may be optionally fixed to the base 20 with adhesive. Next, spacers 28 are positioned over ends of the slide rails 25 and openings 26. The ejector 60 is then placed over the side rails 25 and positioned such that the pivot opening 66 is aligned with the opening 27 of the base 20. Next, the housing 40 is positioned over the ejector 60 such that openings 46 are aligned with openings 26 of the base 20 and opening 43 is aligned with opening 27 of the base 20. The pivot pin 80 is then inserted through openings 43, 66, and 27. Finally, the cover 30 is positioned over the assembly 10 such that openings 36 are aligned with openings 46 and 26. Appropriate fasteners 38 such as bolts are secured through openings 36,46, 26 to nuts 39 (FIG. 3) to complete the assembly.

Figure 2:
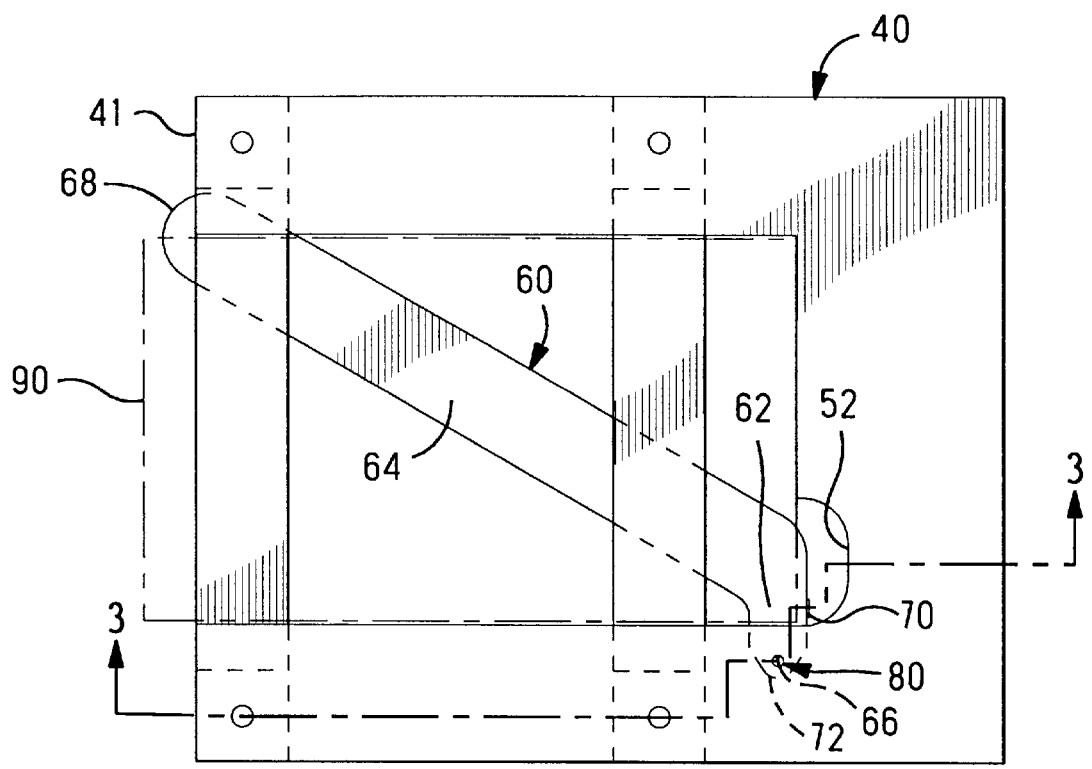
FIG. 2 shows a top view of the ejection mechanism of FIG. 1 having the cover removed and the ejector in a first position with an electronic module in an inserted position.
Figure 4:
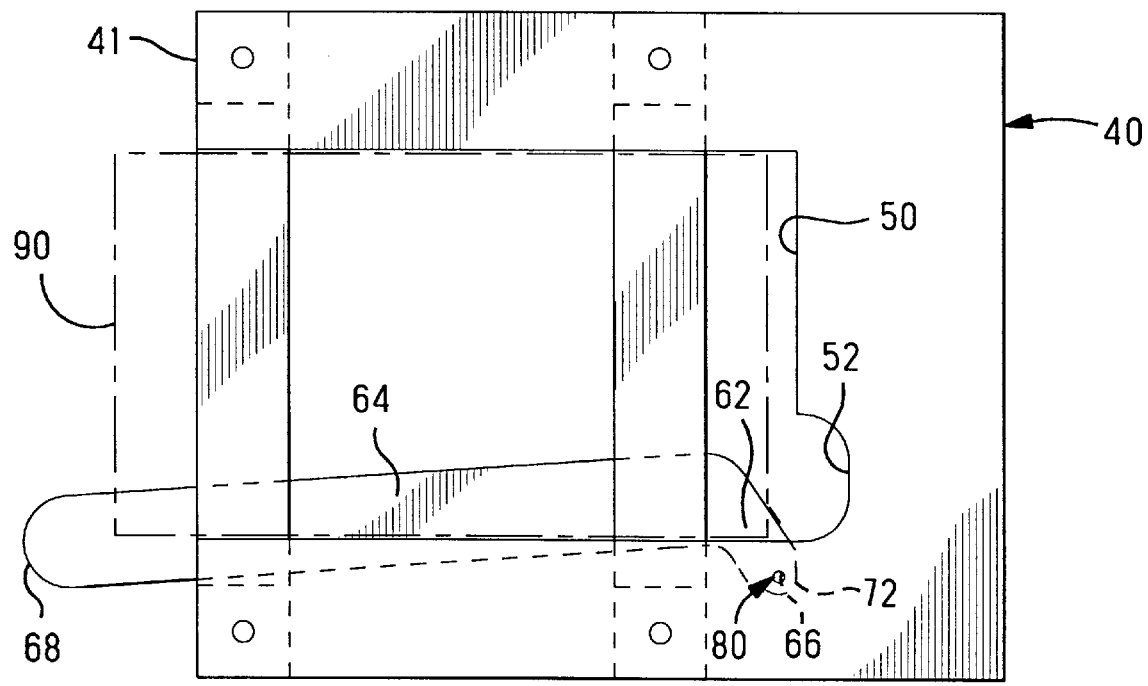
FIG. 4 shows a top view similar to FIG. 2 having the ejector in a second position and the electronic module in an ejected position.

Operation of the ejection mechanism 10 will now be described in greater detail with reference to FIGS. 2, and 4. FIG. 2 shows the ejector 60 in a first position and an electronic module 90 inserted into the module receiving area 48. It should be noted here that a rear end of the electronic module 90 is in engagement with the projection 70 which is positioned within the curved surface 52. In order to eject the electronic module 90, the ejector 60 is moved from the first position shown in FIG. 2 to a second position shown in FIG. 4. The free end 68 may be urged to the second position using a finger or tool. This motion causes rotation about the pivot point 66 and causes the projection 70 to urge the electronic module 90 out of the assembly housing 40. It should be noted here that when the ejector 60 is in the first position shown in FIG. 2, its free and 68 is substantially recessed into the housing 40 to avoid inadvertent ejection of the electronic module 90.

Figure 5:
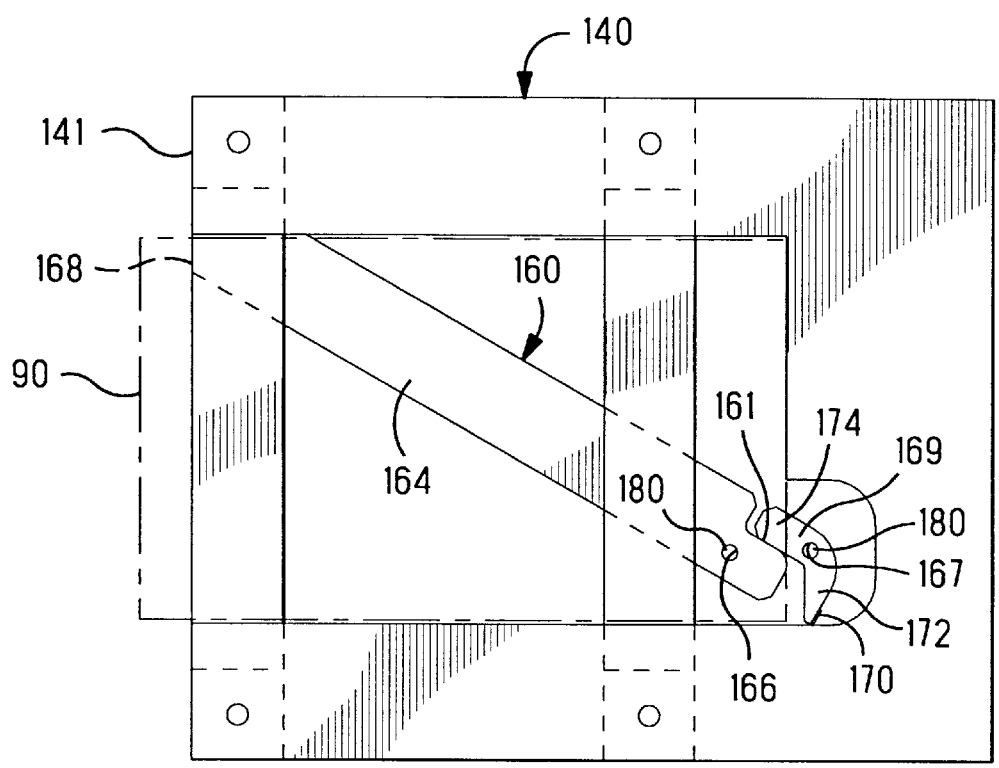
FIG. 5 shows a top view of an alternative ejection mechanism having the cover removed and the ejector in a first position with an electronic module in an inserted position.
Figure 6:
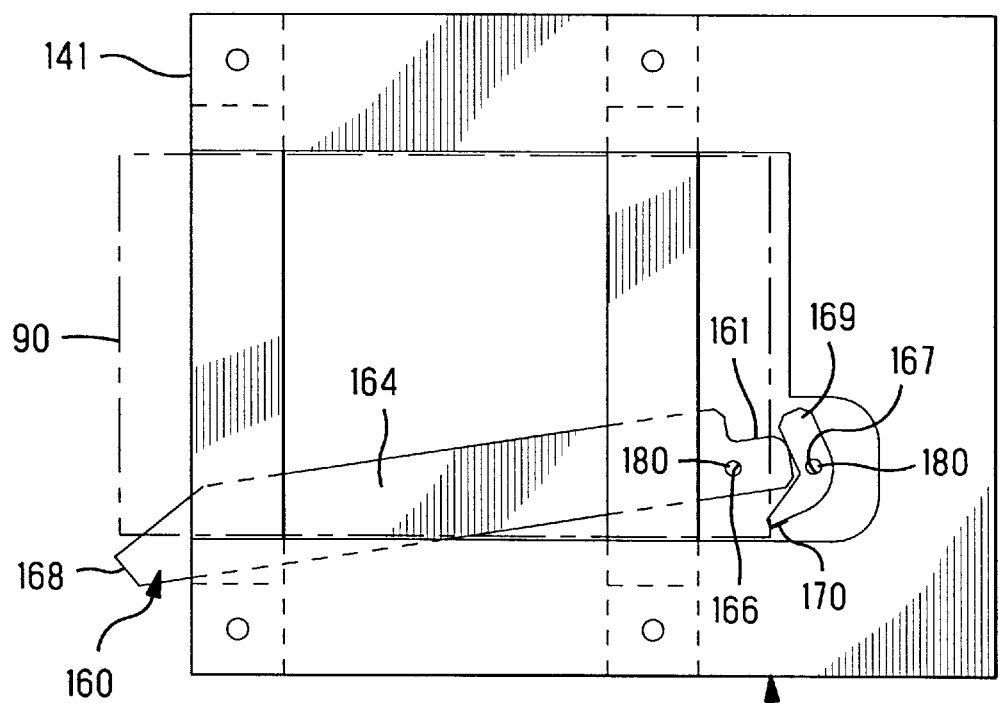
FIG. 6 shows a top view similar to FIG. 5 having the ejector in a second position and the electronic module in an ejected position.

An alternate embodiment of the ejector 160 is shown in FIGS. 5 and 6. These figures are similar to FIGS. 2 and 4 except that the housing 140 has been modified to accommodate two pivot pins 180. The alternate ejector 160 comprises a single leg 164 having a free end 168 disposed near the edge 141. A pivot opening 166 is disposed near an end opposite the free end 168. An indentation 161 is formed near the pivot opening 168. A second pivot member 169 is in engagement with the indentation 161 and fixed to the housing 140 by a second pivot pin 180 disposed in an opening 167. The second pivot member 169 has a projection 170 disposed along a first leg 172 and a second leg 174 extending from the pivot opening 167 at an angle to be first leg 172. In operation, the ejector 160 is rotated from its first position shown in FIG. 5 to its second position shown in FIG. 6. Rotation causes the first leg 164 to engage the second leg 174 of the second pivot member 169 which rotates to engage and eject the electronic module 90 at the projection 170. An advantage of this embodiment is that the ejector 160 requires less space in which to operate since the pivot points 166, 167 lie almost completely within the area beneath the electronic module.

An advantage of the present invention is that it provides an ejection mechanism having fewer parts and a simple linkage without the use of springs for causing ejection of an electronic module from the assembly. An additional advantage is that when the module is in an inserted position, the ejector is concealed within the housing so as to avoid inadvertent ejection of the electronic module.

We claim:

1. An ejection mechanism for an electronic module comprising:
   a housing having an electrical connector receiving area at a first end and a module receiving area extending from the connector receiving area to an open end in an outer edge of the housing,
   an eject lever having a major surface, being mounted to the housing at a pivot point, and having a projection extending angularly from the major surface engageable with a module inserted within the module receiving area, the eject lever extending from the pivot point to a free end disposed beyond the outer edge of the housing and being rotatable about the pivot point such that the free end sweeps across the outer edge during rotation.

2. The ejection mechanism according to claim 1 wherein the eject lever comprises first and second legs oriented at an angle to each other.

3. The ejection mechanism according to claim 2 wherein the projection extends from an edge of the first leg to engage an edge of a module inserted within the module receiving area.

4. The ejection mechanism according to claim 1 further comprising at least a pair of opposed slide rails disposed along the housing and adjacent to opposed major surfaces of the eject lever.

5. The ejection mechanism according to claim 1 further comprising a pin disposed in a pivot opening of the housing and passing through a pivot opening of the eject lever.

6. An electrical connector assembly for a planar electronic module having an electrical connector disposed in a connector receiving area of a housing, the housing having a module receiving area extending from the connector receiving area to an open end in an outer edge of the housing, the assembly being characterized by:
   an ejector formed of a planar material mounted to the housing at a pivot point and extending from the pivot point to a free end, the ejector having a first leg extending from the pivot point and a second leg extending at an angle from the first leg, the first leg having a projection extending from an edge thereof to engage an edge of the module inserted into the module receiving area, the free end being positioned along the outer edge of the housing such that it is urgeable across the outer edge of the housing to cause rotation about the pivot point.

7. The electrical connector assembly according to claim 6 further comprising at least a pair of opposed slide rails disposed along the housing and adjacent to opposed major surfaces of the ejector.

8. The electrical connector assembly according to claim 6 further comprising a pin disposed in a pivot opening of the housing and passing through a pivot opening of the ejector.

9. An ejection mechanism for an electronic module comprising:
   a housing having an electrical connector receiving area at a first end and a module receiving area extending from the connector receiving area to an open end of an outer edge of the housing, and;
   an eject lever being rotatably mounted to the housing such that a free end of the lever is positioned to sweep across the outer edge of the housing during a rotational motion, the lever having an engaging projection being movable by the rotational motion to eject a module inserted into the module receiving area.

* * * * *